(12) United States Patent
Berger et al.

(10) Patent No.: US 11,527,424 B2
(45) Date of Patent: Dec. 13, 2022

(54) SUBSTRATE TRANSFER SYSTEMS AND METHODS OF USE THEREOF

(71) Applicant: APPLIED MATERIALS, INC., Santa Clara, CA (US)

(72) Inventors: Alex Berger, Palo Alto, CA (US); Jeffrey Hudgens, San Francisco, CA (US); Eric Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/825,450

(22) Filed: Mar. 20, 2020

(65) Prior Publication Data
US 2021/0296150 A1 Sep. 23, 2021

(51) Int. Cl.
*H01L 21/677* (2006.01)
*B65G 54/02* (2006.01)
*B25J 11/00* (2006.01)

(52) U.S. Cl.
CPC ..... *H01L 21/67709* (2013.01); *B25J 11/0095* (2013.01); *B65G 54/02* (2013.01)

(58) Field of Classification Search
CPC ......... H01L 21/67155; H01L 21/67173; H01L 21/6719; H01L 21/67184; H01L 21/67196; H01L 21/677; H01L 21/67703; H01L 21/67709; H01L 21/67715; H01L 21/67733; H01L 21/67736; B65G 54/02; B60L 13/04; B60L 13/06; B60L 13/08
See application file for complete search history.

(56) References Cited

U.S. PATENT DOCUMENTS

| | | | |
|---|---|---|---|
| 5,641,054 A | 6/1997 | Mori et al. | |
| 6,394,733 B1* | 5/2002 | Toda | H01L 21/67751 414/221 |
| 7,527,141 B2 | 5/2009 | Rice et al. | |
| 8,197,177 B2* | 6/2012 | van der Meulen | H01L 21/67748 414/805 |

(Continued)

FOREIGN PATENT DOCUMENTS

| | | |
|---|---|---|
| EP | 3016136 A1 | 5/2016 |
| JP | 07115120 A | 5/1995 |
| KR | 10-1386685 B1 | 4/2014 |

OTHER PUBLICATIONS

International Search Report and Written Opinion dated Jul. 12, 2021, on application No. PCT/US2021/23327.

*Primary Examiner* — William R Harp
(74) *Attorney, Agent, or Firm* — Lowenstein Sandler LLP (57) ABSTRACT

Disclosed herein are systems and methods relating to a transfer chamber for an electronic device processing system. The transfer chamber can include a first magnetic levitation track having a face-up orientation and a second magnetic levitation track spaced from the first magnetic levitation track and having a face-down orientation. The system can include substrate carriers that move along the first and second magnetic levitation tracks where each substrate carrier includes a magnet on a bottom portion to interact with a first magnetic field and a second magnet on a top portion to interact with a second magnetic field. The system also can include at least one lift pin assembly to move the substrate carriers in a vertical direction between the first and second magnetic levitation tracks.

20 Claims, 5 Drawing Sheets

(56) References Cited

U.S. PATENT DOCUMENTS

| | | |
|---|---|---|
| 8,851,817 B2 | 10/2014 | Bonora et al. |
| 10,056,279 B2 | 8/2018 | Janakiraman et al. |
| 2011/0038692 A1 | 2/2011 | Hofmeister et al. |
| 2012/0213614 A1 | 8/2012 | Bonora et al. |

* cited by examiner

SUBSTRATE TRANSFER SYSTEMS AND METHODS OF USE THEREOF

FIELD

The disclosure relates generally to the field of robotics and substrate transfer systems that transport substrates between chambers within an isolated environment. The substrates may be transported using a magnetic levitation platform within a transport enclosure. Also disclosed are methods of use of such magnetic levitation platforms in a transfer chamber.

BACKGROUND

Semiconductor devices are produced on semiconductor substrates using numerous process steps within several process chambers. Each process chamber is used to complete one or more of the various steps (e.g., etching, polishing, depositions) to form the semiconductor devices. Substrate transfer systems are used to move the substrates between each of the process chambers. The process chambers and the substrate transfer system can each be held under vacuum. One arrangement used for substrate transfer systems is a linear arrangement where process chambers are arranged in rows along each side of a linear (rectangular) chamber.

A substrate transfer system using a linear arrangement typically includes a conveyor having a rectangular top surface with process chambers on one side or opposing sides of the conveyor. The conveyor can be connected to a load lock in order to maintain the vacuum environment within the substrate transfer system when the substrates are supplied and removed from the substrate transfer system. One or more robots can be positioned near the process chambers to transfer the substrates between the conveyor and the process chambers. Conventional substrate carriers are typically limited to moving substrates in only one direction. Accordingly, movement options for moving substrates between process chambers and to and/or from a load lock may be limited. Additionally, conventional substrate carriers may have a large footprint and internal volume to accommodate one track that moves in first direction and a horizontally offset second track that moves in an opposite second direction.

BRIEF SUMMARY

According to various embodiments, disclosed herein is a transfer chamber for an electronic device processing system, comprising a first magnetic levitation track disposed at a first height within the transfer chamber, wherein the first magnetic levitation track has a face-up orientation configured to generate a first magnetic field above the first magnetic levitation track; a second magnetic levitation track disposed at a second height within the transfer chamber, wherein the second magnetic levitation track has a face-down orientation configured to generate a second magnetic field below the second magnetic levitation track; a plurality of substrate carriers configured to move along the first magnetic levitation track and the second magnetic levitation track, wherein each substrate carrier of the plurality of substrate carriers comprises a first magnet on a bottom of the substrate carrier to interact with the first magnetic field and a second magnet on a top of the substrate carrier to interact with the second magnetic field; and at least one lift pin assembly configured to move the plurality of substrate carriers in a vertical direction between the first magnetic levitation track and the second magnetic levitation track.

According to various embodiments, further disclosed herein is an electronic device processing system, comprising a transfer chamber comprising a first magnetic levitation track disposed at a first height within the transfer chamber, wherein the first magnetic levitation track has a face-up orientation configured to generate a first magnetic field above the first magnetic levitation track; a second magnetic levitation track disposed at a second height within the transfer chamber, wherein the second magnetic levitation track has a face-down orientation configured to generate a second magnetic field below the second magnetic levitation track; a plurality of substrate carriers configured to move along the first magnetic levitation track and the second magnetic levitation track, wherein each substrate carrier of the plurality of substrate carriers comprises a first magnet on a bottom of the substrate carrier to interact with the first magnetic field and a second magnet on a top of the substrate carrier to interact with the second magnetic field; and at least one lift pin assembly configured to move the plurality of substrate carriers in a vertical direction between the first magnetic levitation track and the second magnetic levitation track; a plurality of process chambers connected to the transfer chamber along a length of the transfer chamber; and a first load lock connected to an end of the transfer chamber.

In yet further various embodiments, disclosed herein is a method of moving one or more substrates in a transfer chamber, comprising retrieving a first substrate from a load lock by a first substrate carrier engaged with a first magnetic levitation track positioned proximate to a bottom surface of the transfer chamber, wherein the first magnetic levitation track has a face-up orientation configured to generate a first magnetic field above the first magnetic levitation track; generating the first magnetic field by the first magnetic levitation track to move the first substrate carrier with the first substrate in a first direction along the first magnetic levitation track; lifting, with a first lift pin assembly, the first substrate carrier with the first substrate to a second magnetic levitation track positioned proximate to a top surface of the transfer chamber, wherein the second magnetic levitation track has a face-down orientation configured to generate a second magnetic field below the second magnetic levitation track; detecting that the first substrate carrier is proximate to the second magnetic levitation track; and generating the second magnetic field to suspend the first substrate carrier below the second magnetic levitation track and to move the first substrate carrier with the first substrate in a second opposite direction along the second magnetic levitation track.

BRIEF DESCRIPTION OF THE DRAWINGS

The present disclosure is illustrated by way of example, and not by way of limitation, in the figures of the accompanying drawings in which like references indicate similar elements.

DETAILED DESCRIPTION

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a lift pin" includes a single lift pin as well as more than one lift pin.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

According to embodiments, disclosed herein is a transfer chamber having a bi-directional magnetic levitation platform for use in a semiconductor device manufacturing system. In embodiments, the bi-directional magnetic levitation platform has a linear configuration with a narrow (e.g., not much wider than a wafer's diameter) internal width that can move wafers in either direction without breaking vacuum and that may provide random access to process chambers connected to thereto. In embodiments, the system includes two magnetic levitation platforms, one at the top of the transfer chamber and one at the bottom of the transfer chamber in a facing arrangement.

The bi-direction vacuum magnetic levitation platform not only has a narrow, small footprint (i.e., about the width of a wafer's diameter), but enables a flexible-wafer flow, eliminates the need to break vacuum during wafer transport, has a small vacuum volume and is relatively easy to service. According to embodiments, the bi-directional magnetic levitation system as described herein is a single volume platform, optionally, without load-locks. The system enables random chamber access on either forward or return magnetic levitation tracks.

In embodiments, the transfer system (also referred to as a transfer chamber) has two magnetic levitation tracks. The top track is disposed at a top of the transfer chamber and oriented upside down with a surface that provides motive force (e.g., a stator of a linear motor) facing down into the interior volume of the transfer chamber. The bottom track is disposed at a bottom of the transfer chamber and oriented right side up with a surface that provides motive force (e.g., a stator of another linear motor) facing up into the interior volume of the transfer chamber. The top track and the bottom track may each be or include stators of linear motors. The substrate carriers have two sets of magnets (or two movers of linear motors), one on top of another, arranged in a way so they do not short each other's magnetic fields. One mover (e.g., one set of magnets) may be disposed on a top of each substrate carrier, and one mover (e.g., one set of magnets) may be disposed on a bottom of each substrate carrier. This arrangement enables the substrate carriers to be moved by the lower linear motor (e.g., and ride the lower track) as well as be moved by the upper linear motor (e.g., and ride the upper track). Transition between tracks may be effected by a series of lift pin assemblies that may be isolated from atmosphere using bellows. Each lift pin assembly has a set of lift pins that can lift a substrate carrier (which may include a wafer attached thereto, such as a wafer on an end effector of the substrate carrier) from the bottom track to the top track and/or lower the substrate carrier from the top track to the bottom track. When the substrate carrier with the wafer attached thereto reaches a certain proximity to the top magnetic levitation track (e.g., sensed by a track sensing system), the top track may activate a magnetic field in the proximity of the substrate carrier, securing the substrate carrier to the top track. The bottom track may be configured to move substrate carriers in a first direction, and the top track may be configured to move substrate carriers in an opposite second direction. Accordingly, the substrate carriers and supported substrates can freely move in both directions to a destination point without causing collisions between substrate carriers and with minimal internal volume of the transfer chamber and a minimal footprint of the transfer chamber.

The bi-directional magnetic levitation system can include a plurality of lift pin assemblies, so the substrate carrier can transit to and from the top track at several locations. This enables a wafer, for example, to be moved in a first direction from a load lock to chamber #2 via the bottom track, processed in chamber #2, transferred in the first direction to chamber #4 via the bottom track, processed in chamber #4, transferred in a second direction back to chamber #3 via the top track, processed in chamber #3, and moved in the second direction back to the load lock via the top track.

According to embodiments, described herein are transfer chambers for electronic device processing systems, comprising a first magnetic levitation track disposed at a first height within the transfer chamber, wherein the first magnetic levitation track has a face-up orientation configured to generate a first magnetic field above the first magnetic levitation track; a second magnetic levitation track disposed at a second height within the transfer chamber, wherein the second magnetic levitation track has a face-down orientation configured to generate a second magnetic field below the second magnetic levitation track; a plurality of substrate carriers configured to move along the first magnetic levitation track and the second magnetic levitation track, wherein each substrate carrier of the plurality of substrate carriers comprises a first magnet on a bottom of the substrate carrier to interact with the first magnetic field and a second magnet on a top of the substrate carrier to interact with the second magnetic field; and at least one lift pin assembly configured to move the plurality of substrate carriers in a vertical direction between the first magnetic levitation track and the second magnetic levitation track. According to embodiments, the first magnet on the bottom of the substrate carrier can be a magnet system comprising, for example, a plurality of magnets arranged in a Hallbach array so that they do not impact operation of the other magnet system. The first magnet (system) can be in a right-side-up orientation. The second magnet on the top of the substrate carrier can be a second magnet system also comprising, for example, a plurality of magnets arranged in a Hallbach array so that they do not impact operation of the other magnet system. The second magnet (system) can be oriented in an upside down configuration.

Arranging the first and second magnetic levitation tracks in a facing configuration reduces the footprint of the transfer chamber as well as the interior volume of the transfer chamber that is pumped down to vacuum. Additionally, according to embodiments, all of the electronics of the transfer chamber can be positioned on the atmospheric side of the transfer chamber. According to embodiments, the transfer chamber may not comprise an elevator. Rather, the transfer chamber may comprise a plurality of lift pin assemblies that can move the substrate carriers (and supported substrates such as wafers) between the first and second magnetic levitation tracks at various points along the transfer chamber. In further embodiments, the substrate carrier comprises two sets of magnets that allow it to travel along first and second tracks without flipping over.

Figure 1A:
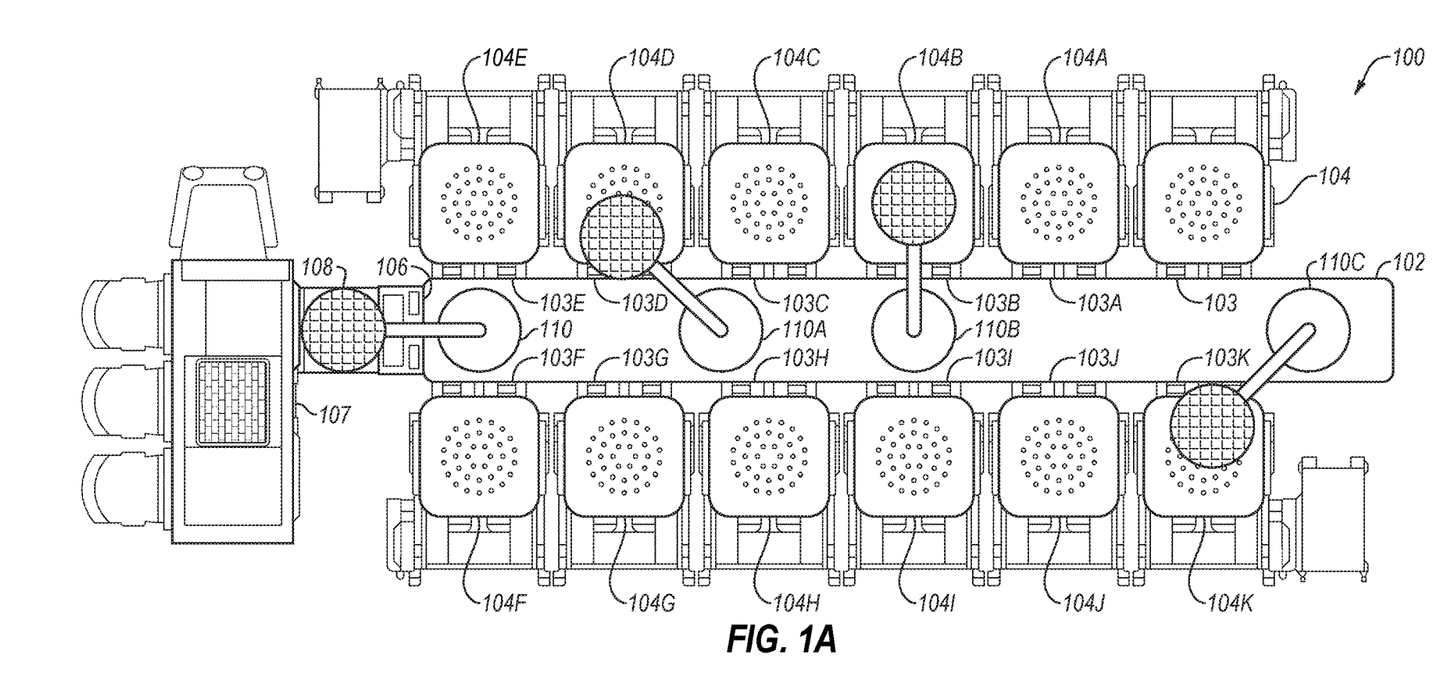
FIG. 1A depicts a top view of a substrate transfer system according to various embodiments.

Referring to FIG. 1A, a transfer chamber 102, for an electronic device processing system 100, can have at least one port 103 configured to permit access to at least one process chamber 104. In embodiments, the transfer chamber 102 can have a plurality of ports 103, 103A-103K where each of the ports is configured to permit access to one of a plurality of process chambers 104, 104A-104K. Each port may include a slit valve that is sized to receive an end effector holding a substrate (e.g., a wafer). In one embodiment, all of the ports 103, 103A-K and/or slit valves are co-planar and share a common height. Alternatively, different ports and/or slit valves may be positioned at different heights and/or planes. Additionally, in one embodiment, all ports 103, 103A-K and/or slit valves have a common opening pitch (vertical dimension of the opening). The common opening pitch may be a single height pitch that can receive an end effector and substrate positioned at a specific height or a multi-height pitch that can receive end effectors and substrates positioned at multiple different heights (e.g., end effectors and substrates of substrate carriers attached to a bottom track as well as end effectors and substrates of substrate carriers attached to a top track). Alternatively, different ports 103, 103A-K may have different opening pitches.

According to embodiments, the transfer chamber can have a length and a width, where a first dimension of the length is orders of magnitude greater than a second dimension of the width. The plurality of ports 103, 103A-103K can be disposed along the length of the transfer chamber 102. In embodiments, the ports 103, 103A-K may be oriented approximately orthogonal to the length of the transfer chamber 102. In embodiments, the length is about 5 ft to about 20 ft, or about 6 ft, or about 8 ft, or about 10 ft, or about 12 ft, or about 14 ft, or about 16 ft, or about 18 ft, or about 20 ft, and so on. In embodiments, the transfer chamber 102 can further include an additional port 106 configured to permit access to a load lock 107 (or multiple additional ports each configured to permit access to one or more load locks). The additional port 106 can be disposed at a first end of the transfer chamber 102 along the width of the transfer chamber 102. The load lock 107 may be connected to a factory interface 109 containing one or more front opening unified pods (FOUPs) 111. The factory interface contains a robot (not shown) that takes wafers from the FOUPs 111 and places them in the load lock 107 for the substrate carriers 110, 110A-C to retrieve them from the load lock 107.

In some embodiments, the first port may be approximately orthogonal to ports 103, 103A-K. In embodiments, the width of the transfer chamber 100 is approximately equal to the width of the load lock 107 or the width of a substrate 108, 108A-108C. In embodiments, the width of the transfer chamber 100 is about 2 mm to about 20 mm wider than the load lock 107 and/or a substrate 108, 108A-108C.

The transfer chamber system 100 includes at least one substrate carrier 110, 110A-110C configured to transfer a substrate 108, 108A-108C between the at least one process chamber 104, 104A-104K and the transfer chamber 102. According to embodiments, the transfer chamber 102 can contain several substrate carriers 110, 110A-110C, for example, 2, 3, 4, 5, 6, 7, 8, 9 or 10, or about 2 to about 10 substrate carriers.

Figure 1B:
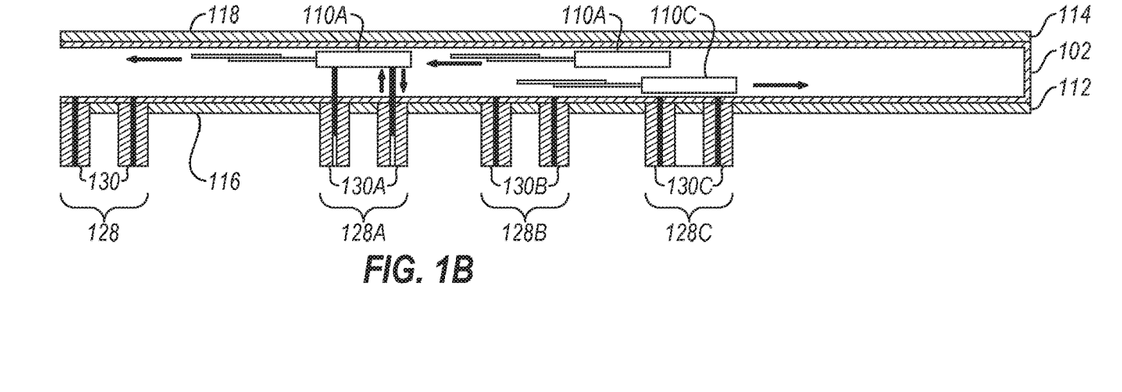
FIG. 1B depicts a side view of a substrate transfer system according to various embodiments.

Each substrate carrier 110, 110A-110C is configured to move using a magnetic levitation conveyor system (e.g., one or more linear motors). For example, each substrate carrier 110, 110A-110C can move along at least one magnetic levitation track 112, 114 as shown in FIG. 1B. According to embodiments, the transfer chamber 102 can include two magnetic levitation tracks 112, 114, a first magnetic levitation track 112 (e.g., a first stator of a linear motor) on a bottom interior surface 116 of the transfer chamber 102 and a second magnetic levitation track 114 (e.g., a second stator of another linear motor) on an opposite, top interior surface 118 of the transfer chamber 102. The first magnetic levitation track 112 can be configured to move substrate carriers 110, 110A-C in a forward direction (away from the load lock) while the second magnetic levitation track 114 can be configured to move substrate carriers 110, 110A-C in an opposite, reverse direction. In embodiments (not shown), the first magnetic levitation track 112 can be on the bottom interior surface 116 while the second magnetic levitation track 114 can be on the top interior surface 118. The magnetic levitation tracks 112, 114 can be in a facing arrangement (e.g., with the first magnetic levitation track 112 in a face-up orientation and the second magnetic levitation track 114 in a face-down orientation) as shown in FIG. 1B. In embodiments, the first track 112 and the second track 114 may be spaced apart by a distance of about 40 mm to about 300 mm, or about 100 mm to about 250 mm, or about 150 mm to about 200 mm.

According to embodiments, the first magnetic levitation track 112 can be configured to move one or more of a plurality of substrate carriers 110, 110A-110C in a first direction along the length of the transfer chamber 102. The second magnetic levitation track 114 can be configured to move one or more of the plurality of substrate carriers 110, 110A-110C in a second direction along the length of the transfer chamber 102, wherein the second direction is opposite the first direction. For example, the first magnetic levitation track 112 may move substrate carriers 110, 110A-

110C from a load lock 106, into the transfer chamber 102 and into a process chamber 104, 104A-104K. Correspondingly, the top magnetic levitation track 114 may move substrate carriers 110, 110A-110C from a process chamber 104, 104A-104K, through the transfer chamber 102 and to the load lock 106. In embodiments, the transfer chamber system can include at least one position sensor for monitoring a position of the substrate carriers 110, 110A-110C. In one embodiment, the first and second magnetic levitation tracks 112, 114 may include a position sensor functionality.

Figure 1C:
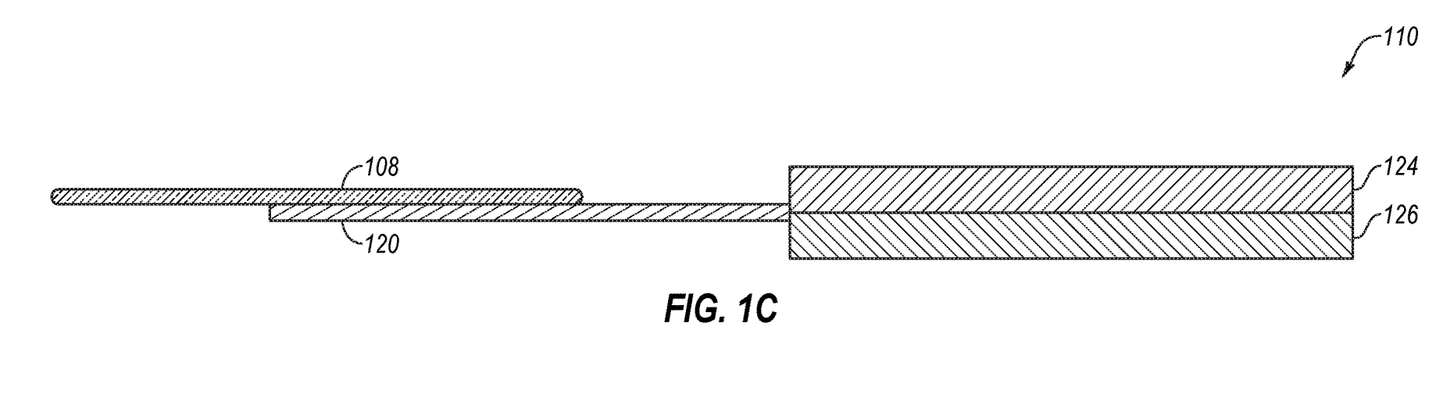
FIG. 1C depicts a substrate carrier according to various embodiments.

FIG. 1C shows an embodiment of a substrate carrier 110 suitable for use in the transfer chamber system 100 according to embodiments. The substrate carrier 110 can include an end effector 120 for receiving, lifting and holding a substrate 108, such as a wafer, and/or on which a substrate may be placed. Any suitable end effector 120 for use in a semiconductor processing system can be used as would be understood by those of ordinary skill in the art. According to embodiments, the one or more substrate carrier 110 can be a robot arm as known to those of ordinary skill in the art. The substrate carrier 110 can include an upper magnetic portion 124 and a lower magnetic portion 126. The lower magnetic portion 126 may be, for example, a first mover of a first linear motor. The upper magnetic portion 124 may be, for example, a second mover of a second linear motor. Alternatively, the upper magnetic portion and the lower magnetic portion may be upper and lower halves of a single mover that is configured to engage with a first stator below the substrate carrier 110 and a second stator above the substrate carrier 110. The upper magnetic portion 124 may include one or more magnets (e.g., permanent magnets), and the lower magnetic portion 126 may include one or more additional magnets. The upper and lower magnetic portions may be configured such that their magnetic fields do not interfere with one another. The magnetic levitation conveyor system includes one or more electromagnets (not shown) for controlling movement of the substrate carriers and linear motors (not shown) for moving the substrate carriers 110, 110A-110C.

Referring back to FIGS. 1A-1B, according to embodiments, the plurality of ports 103, 103A-103K can be or include a plurality of slit valves. A first transfer plane of at least a first subset of the plurality of slit valves is accessible to the substrate carriers 110C engaged with the first magnetic levitation track 112. A second transfer plane of a second subset of the plurality of slit valves can be accessible to substrate carriers 110A, 110B engaged with the second magnetic levitation track 114. To further improve throughput and enable approximately simultaneous swapping of substrates in a process chamber 104, 104A-104K or load lock 107, at least some of the plurality of slit valves have a first wafer transfer plane and a second wafer transfer plane that is above the first wafer transfer plane. The first wafer transfer plane can be accessible to substrate carriers 110C that are engaged with the first magnetic levitation track 112. The second wafer transfer plane can be accessible to substrate carriers 110A, 110B that are engaged with the second magnetic levitation track. For example, a first substrate carrier 110C engaged with the first magnetic levitation track 112 can enter a process chamber 104, 104A-104K while a second substrate carrier 110A, 110B engaged with the second magnetic levitation track 114 and holding a substrate thereon 108, 108A-108C can be positioned above the first substrate carrier 110C. Once (or while) the first substrate is removed from the process chamber in the first transfer plane, the second substrate can be loaded into the same process chamber in a second transfer plane completing a swap of the first substrate (e.g., which just finished processing) and the second substrate (e.g., which requires processing). In further embodiments, the plurality of slit valves can have a common transfer plane accessible to substrate carriers 110, 110A-110C that are engaged with the first magnetic levitation track 112 as well as to substrate carriers 110, 110A-110C that are engaged with the second magnetic levitation track 114. The slit valve openings can be sized according to the configuration of the transfer planes. The slit valve opening may be about 1 inch to about 20 inches for a single transfer plane and about 2 inches to about 20 inches when there are two transfer planes. For example, if there are two wafer transfer planes, the slit valve opening may be larger than if there is one wafer transfer plane.

According to embodiments, the system can include a first load lock 107 and a second load lock (not shown). The first load lock 107 can be accessible to substrate carriers 110, 110C that are engaged with the first magnetic levitation track. The second load lock can be stacked above the first load lock 107 at the end of the transfer chamber 102. The second load lock can be accessible to substrate carriers 110A, 110B that are engaged with the second magnetic levitation track. In embodiments, a first height of the transfer chamber 102 at the end near the first load lock 107 can be greater than a second height of a remainder of the transfer chamber 102. In further embodiments, the first load lock 107 and the second load lock can be arranged in a side-by-side configuration at an angle relative to the length of the transfer chamber (e.g., a 30 or 45 degree angle).

According to embodiments, the system includes at least one lift pin assembly 128, 128A-128C configured to receive a substrate 108, 108 A-108C and to lift and/or lower the substrate between transfer planes and/or between magnetic levitation tracks 112, 114. The lift pin assembly 128, 128A-128C can include one or more lift pins, for example, a pair or trio of lift pins 130, 130A-130C. The lift pins 130, 130A-130C can be configured to pass through the bottom surface 116 of the transfer chamber 102 and may have an atmospheric-facing side and a vacuum-facing side. The atmospheric-facing side can be outside of the bottom surface of the transfer chamber 102. The lift pins 130, 130A-130C may be enclosed in a bellows to maintain the vacuum environment in the transfer chamber. The lift pins 130, 130A-130C can be configured to extend into the transfer chamber 102 on the vacuum-facing side. In embodiments, the at least one lift pin assembly 128, 128A-128C can be configured to move a substrate carrier 110 that is positioned in front of the first load lock 107 in a vertical direction to cause the substrate carrier 110 to reach a transfer plane above the second height of the remainder of the transfer chamber 102 (discussed above). During operation, when a lift pin 130, 130A-130C lifts a substrate carrier 110, 110A-110C to a certain proximity with the top track 118, a magnetic field can be activated in the proximity of a substrate carrier. The magnetic field in the proximity of the substrate carrier 110, 110A-110C can be deactivated when a lift pin 130, 130A-130C engages with the substrate carrier 110, 110A-110C on the top track 118 to move the substrate to the lower track 112 via the lift pin 130, 130A-130C.

Figure 2:
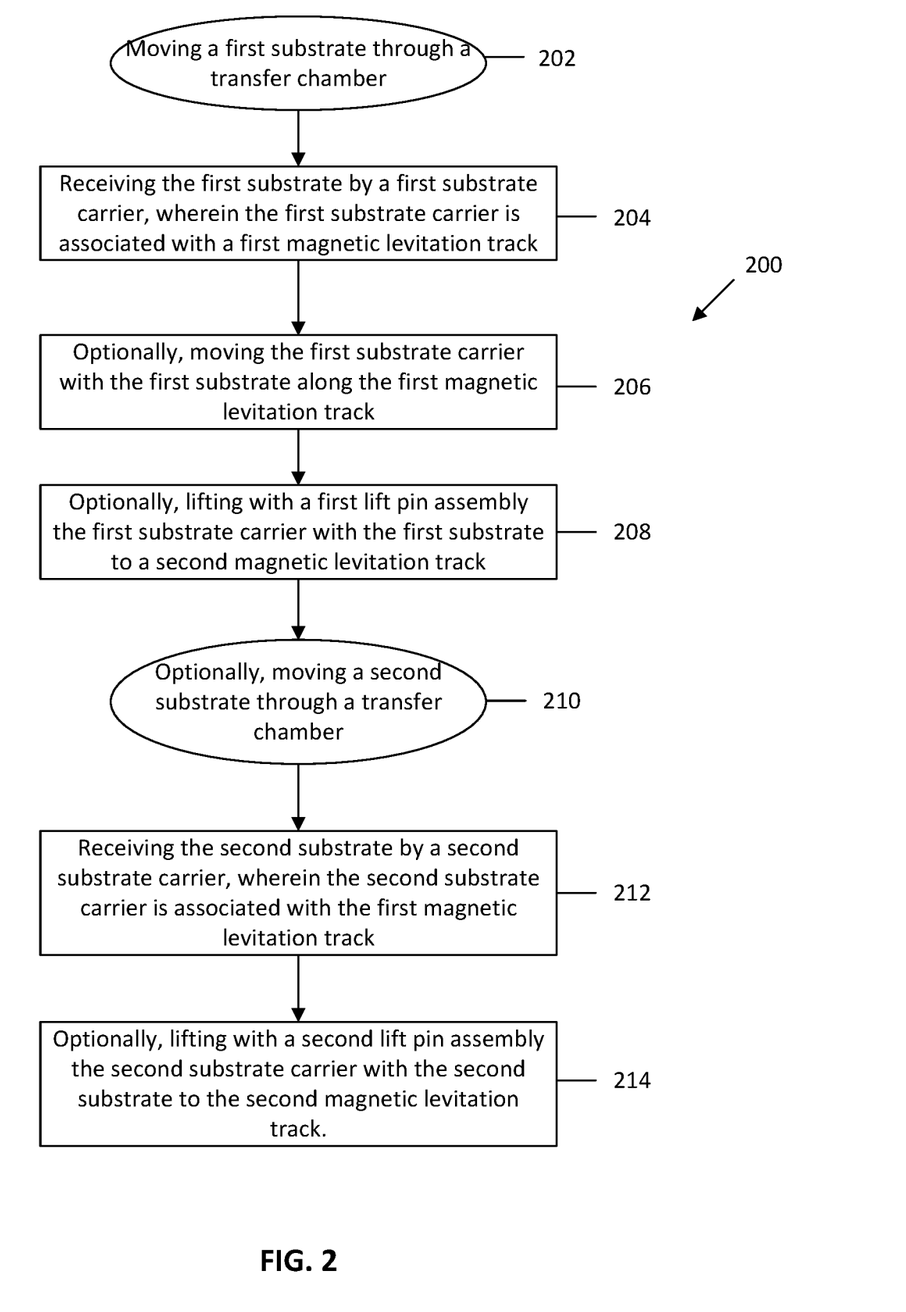
FIG. 2 illustrates a method of moving a wafer through a transfer chamber according to various embodiments.

Further described herein are methods of using a transfer chamber system according to various embodiments. Referring to FIG. 2, the method 200 can include at block 202 moving a first substrate through a transfer chamber. The moving 202 can include at block 204 receiving the first substrate by a first substrate carrier, wherein the first substrate carrier is associated with a first magnetic levitation track positioned on a bottom surface of the transfer chamber.

In embodiments, the receiving 204 can include moving an end effector of the substrate carrier into a semiconductor process chamber associated with the transfer chamber and receiving the first substrate on the end effector.

The moving 202 further can include, optionally, at block 206 moving the first substrate carrier with the first substrate along the first magnetic levitation track. Additionally or alternatively, the moving 202 further can include, optionally, at block 208 lifting with a first lift pin assembly the first substrate carrier with the first substrate to a second magnetic levitation track positioned on a top surface of the transfer chamber, wherein the second magnetic levitation track is in a facing arrangement to the first magnetic levitation track. As set forth above, the transfer chamber according to various embodiments herein may be connected with at least one semiconductor process chamber, for example, in a linear arrangement.

According to embodiments, the method 200 further can include optionally, at block 210, moving a second substrate through the transfer chamber. The moving 210 further can include, optionally at block 212, receiving the second substrate by a second substrate carrier, wherein the second substrate carrier is associated with the first magnetic levitation track. The moving 210 further can include moving the second substrate carrier with the second substrate along the first magnetic levitation track. Additionally or alternatively, the moving 210 further can include at block 214 lifting with a second lift pin assembly the second substrate carrier with the second substrate to the second magnetic levitation track.

According to embodiments, the receiving 212 can include removing the substrate from a semiconductor process chamber by the first substrate carrier. According to embodiments, method 200 can further include lifting 208 with the first lift pin assembly the first substrate carrier with the first substrate and moving the second substrate carrier with the second substrate along the first magnetic levitation track, wherein the second substrate carrier positions the second substrate in the semiconductor process chamber. In embodiments, the first substrate carrier can move in a first direction along a first track (e.g., the bottom track) and the second substrate carrier can move in a second direction along a second track (e.g., the top track). The first and second substrate carriers are able to pass each other without collision.

According to various embodiments, referring again to FIGS. 1A and 1B, during operation, a substrate (e.g., a wafer) positioned in the load lock 107 can be removed in a first transfer plane from the load lock by a first substrate carrier 110. The first substrate carrier 110 having the substrate thereon can then move along a first track 112 in a first direction to a first process chamber 104F. If the first substrate carrier 110 is already in a transfer plane and the first process chamber 104F is ready to receive the substrate, then the first substrate carrier 110 positions the substrate in the first process chamber 104F. If the first substrate carrier having the substrate thereon is not in a transfer plane, then the first substrate carrier can be positioned above a first lift pin assembly 128 proximate the first process chamber 104F. The first lift pin assembly 128 can lift the substrate carrier 110 having the substrate thereon into the transfer plane where the first substrate carrier places the substrate in the first process chamber 104F when the first process chamber 104F is ready to receive the substrate. The first substrate carrier 110 is now free to collect another substrate either from the load lock 107 or from another process chamber 104, 104A-104E, 104G-104K.

In embodiments, the first substrate carrier 110 may be lifted to the second track 114 by the first lift pin assembly 128 and, for example, returned in a second direction to the load lock 107 to collect another substrate. Alternatively, the substrate carrier may be lowered by the first lift pin assembly 128 to the first track 112, unless the first substrate carrier 110 is already engaged with the first track 112, where the first substrate carrier 110 can move along the first track 112 to another process chamber 104A-104E, 104G-104K. In embodiments, the substrate carrier 110 can wait at the first process chamber 104F until the completion of the process step on the substrate. In embodiments, the substrate may then be transferred to a second process chamber 104B using either the first substrate carrier 110 or using a second substrate carrier 110A-110C. Moving substrates between process chambers and the load lock, between tracks, and in and out of transfer planes can be repeated as needed to provide continuous and efficient operation of substrate processing. Once the substrate has been processed by all necessary process steps in corresponding process chambers, the substrate carrier having the substrate thereon may be lifted to the second track 114 and returned proximate to the load lock 107 along the second direction.

In embodiments, the load lock transfer plane may be below the second track 114, so the substrate carrier having the substrate thereon may be lowered by the lift pin assembly 128 to the transfer plane, which in some embodiments, may be even with the first track 112. According to certain embodiments, the transfer chamber 102 may be connected to a single load lock 107 or a plurality of load locks (not shown). For example, the transfer chamber may be connected to two load locks in a vertical arrangement. In this configuration, a substrate carrier engaged with the top track can be loaded into the upper load lock. In certain embodiments, the load locks may be in a side-by-side arrangement and the substrate carriers may be lifted or lowered to align with the transfer plane.

Figure 3:
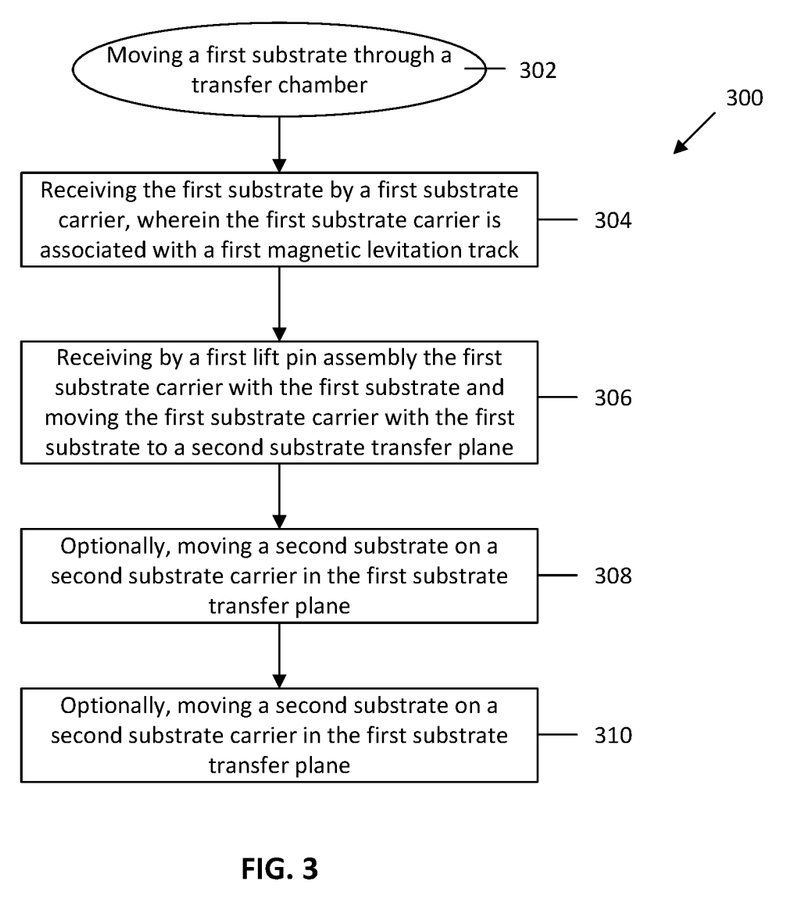
FIG. 3 illustrates a method of moving a wafer through a transfer chamber according to various embodiments.

The disclosure further relates to a method 300, as shown in FIG. 3, comprising at block 302 moving one or more substrates through a transfer chamber according to embodiments described herein. The moving 302 can include at block 304 receiving a first substrate by a first substrate carrier, wherein the first substrate carrier is associated with a first magnetic levitation track according to embodiments herein.

At block 306 the method 300 can include receiving by a first lift pin assembly the first substrate carrier with the first substrate and moving the first substrate carrier with the first substrate to a second substrate transfer plane. Method 300 further can include, optionally at block 308, moving a second substrate on a second substrate carrier in the first substrate transfer plane. A magnetic field may be activated in the bottom track to secure the second substrate carrier to the top track. At block 310, method 300 further can include, optionally moving a second substrate on a second substrate carrier in the first substrate transfer plane.

According to embodiments, methods herein can include detecting the position of each of the substrate carriers and transporting them along and between each of the first and second magnetic levitation tracks. As the substrate carriers move along the magnetic levitation tracks, lift pin assemblies can lift and lower the carriers between the tracks. This configuration enables flexible movement of substrates between process chambers and between process chambers and the at least one load lock. This flexibility coupled with the relatively small footprint of the transfer chamber increases wafer throughput in an electronic device processing system.

Figure 4:
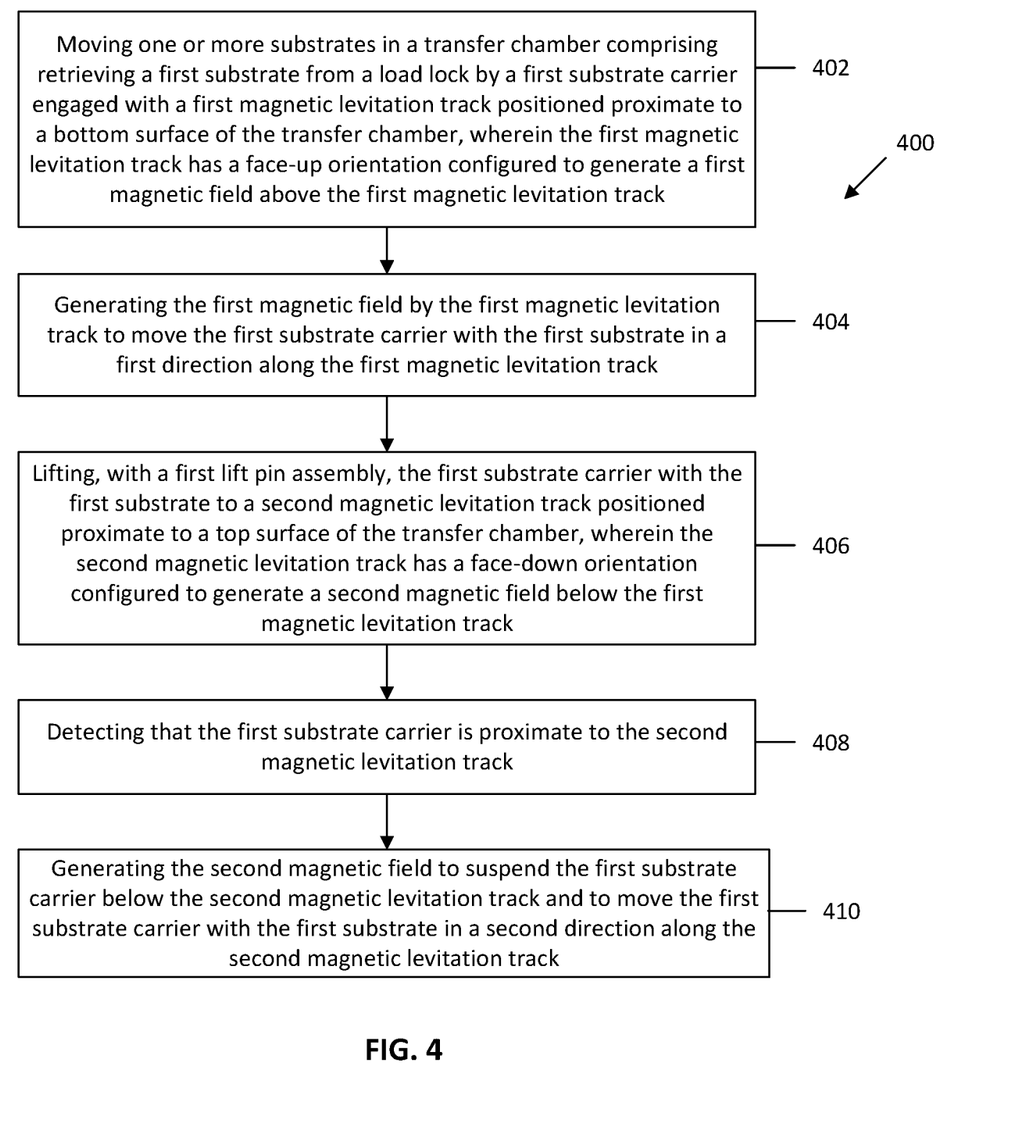
FIG. 4 illustrates a method of moving a wafer through a transfer chamber according to various embodiments.

The disclosure further relates to a method 400, as shown in FIG. 4, for moving one or more substrates in a transfer chamber, comprising at block 402, retrieving a first substrate from a load lock by a first substrate carrier engaged with a first magnetic levitation track positioned proximate to a bottom surface of the transfer chamber, wherein the first magnetic levitation track has a face-up orientation configured to generate a first magnetic field above the first magnetic levitation track. At block 404 the method further includes generating the first magnetic field by the first magnetic levitation track to move the first substrate carrier with the first substrate in a first direction along the first magnetic levitation track. At block 406, the method further includes lifting, with a first lift pin assembly, the first substrate carrier with the first substrate to a second magnetic levitation track positioned proximate to a top surface of the transfer chamber, wherein the second magnetic levitation track has a face-down orientation configured to generate a second magnetic field below the second magnetic levitation track. According to embodiments, the method further includes at block 408 detecting that the first substrate carrier is proximate to the second magnetic levitation track. In embodiments, the method further includes generating the second magnetic field to suspend the first substrate carrier below the second magnetic levitation track and to move the first substrate carrier with the first substrate in a second direction along the second magnetic levitation track.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

We claim:

1. A transfer chamber for an electronic device processing system, comprising:
   a first magnetic levitation track disposed at a first height within the transfer chamber, wherein the first magnetic levitation track has a face-up orientation configured to generate a first magnetic field above the first magnetic levitation track;
   a second magnetic levitation track disposed at a second height within the transfer chamber, wherein the second magnetic levitation track has a face-down orientation configured to generate a second magnetic field below the second magnetic levitation track; and
   at least one lift pin assembly within the transfer chamber, the at least one lift pin assembly configured to move a plurality of substrate carriers in a vertical direction within the transfer chamber between the first magnetic levitation track and the second magnetic levitation track.

2. The transfer chamber of claim 1, further comprising a plurality of substrate carriers configured to move along the first magnetic levitation track and the second magnetic levitation track, wherein each substrate carrier of the plurality of substrate carriers comprises a first magnet on a bottom of the substrate carrier to interact with the first magnetic field and a second magnet on a top of the substrate carrier to interact with the second magnetic field.

3. The transfer chamber of claim 2, wherein a substrate carrier of the plurality of substrate carriers comprises an end effector for holding a substrate, wherein at least one of the first magnetic levitation track or the second magnetic levitation track is configured to cause the substrate carrier to rotate to place the substrate into a process chamber.

4. The transfer chamber of claim 1, wherein the transfer chamber comprises a plurality of ports, and wherein each of the plurality of ports is configured to permit access to a process chamber.

5. The transfer chamber of claim 4, wherein the transfer chamber comprises a length and a width, wherein a first dimension of the length is orders of magnitude greater than a second dimension of the width, and wherein the plurality of ports are disposed along the length of the transfer chamber.

6. The transfer chamber of claim 5, further comprising an additional port configured to permit access to a load lock, wherein the additional port is disposed at a first end of the transfer chamber along the width of the transfer chamber.

7. The transfer chamber of claim 6, wherein the width of the transfer chamber is not less than a width of the load lock or a width of a substrate.

8. The transfer chamber of claim 4, wherein the plurality of ports are a plurality of slit valves, wherein a first transfer plane of at least a first subset of the plurality of slit valves is accessible to substrate carriers of the plurality of substrate carriers that are engaged with the first magnetic levitation track.

9. The transfer chamber of claim 8, wherein a second transfer plane of a second subset of the plurality of slit valves is accessible to substrate carriers of the plurality of substrate carriers that are engaged with the second magnetic levitation track.

10. The transfer chamber of claim 4, wherein the plurality of ports are a plurality of slit valves, wherein at least some of the plurality of slit valves have a first wafer transfer plane and a second wafer transfer plane that is above the first wafer transfer plane, the first wafer transfer plane is accessible to substrate carriers of the plurality of substrate carriers that are engaged with the first magnetic levitation track and wherein the second wafer transfer plane is accessible to substrate carriers of the plurality of substrate carriers that are engaged with the second magnetic levitation track.

11. The transfer chamber of claim 4, wherein the plurality of ports are a plurality of slit valves, wherein a common transfer plane of at least some of the plurality of slit valves is accessible to substrate carriers of the plurality of substrate carriers that are engaged with the first magnetic levitation track and to substrate carriers of the plurality of substrate carriers that are engaged with the second magnetic levitation track.

12. The transfer chamber of claim 1, wherein the first magnetic levitation track is configured to move one or more of the plurality of substrate carriers in a first direction along the length of the transfer chamber, and wherein the second magnetic levitation track is configured to move one or more of the plurality of substrate carriers in a second direction along the length of the transfer chamber, wherein the second direction is opposite the first direction.

13. The transfer chamber of claim 1, wherein the first track and the second track are spaced apart a distance of about 40 mm to about 300 mm.

14. An electronic device processing system, comprising:
a transfer chamber comprising:
   a first magnetic levitation track disposed at a first height within the transfer chamber, wherein the first magnetic levitation track has a face-up orientation configured to generate a first magnetic field above the first magnetic levitation track;
   a second magnetic levitation track disposed at a second height within the transfer chamber, wherein the second magnetic levitation track has a face-down orientation configured to generate a second magnetic field below the second magnetic levitation track;
   a plurality of substrate carriers configured to move along the first magnetic levitation track and the second magnetic levitation track, wherein each substrate carrier of the plurality of substrate carriers comprises a first magnet on a bottom of the substrate carrier to interact with the first magnetic field and a second magnet on a top of the substrate carrier to interact with the second magnetic field; and
   at least one lift pin assembly configured to move the plurality of substrate carriers in a vertical direction between the first magnetic levitation track and the second magnetic levitation track;
a plurality of process chambers connected to the transfer chamber along a length of the transfer chamber; and
a first load lock connected to an end of the transfer chamber.

15. The electronic device processing system of claim 14, wherein the first load lock is accessible to substrate carriers of the plurality of substrate carriers that are engaged with the first magnetic levitation track, the electronic device processing system further comprising:
a second load lock stacked above the first load lock at the end of the transfer chamber, wherein the second load lock is accessible to substrate carriers of the plurality of substrate carriers that are engaged with the second magnetic levitation track.

16. The electronic device processing system of claim 14, wherein a first height of the transfer chamber at the end of the transfer chamber near the first load lock is greater than a second height of a remainder of the transfer chamber, the transfer chamber further comprising:
a lift pin assembly configured to move a substrate carrier of the plurality of substrate carriers that is positioned in front of the first load lock in a vertical direction to cause the substrate carrier to reach a transfer plane that is above the second height.

17. The electronic device processing system of claim 14, wherein the transfer chamber comprises a length and a width, wherein a first dimension of the length is orders of magnitude greater than a second dimension of the width, and wherein a plurality of ports are disposed along the length of the transfer chamber,
optionally, wherein the width of the transfer chamber is approximately equal to a width of the load lock or a width of a substrate.

18. The electronic device processing system of claim 14, wherein the first magnetic levitation track is configured to move one or more of the plurality of substrate carriers in a first direction along the length of the transfer chamber, and wherein the second magnetic levitation track is configured to move one or more of the plurality of substrate carriers in a second direction along the length of the transfer chamber, wherein the second direction is opposite the first direction.

19. A method of moving one or more substrates in a transfer chamber, comprising:
retrieving a first substrate from a load lock by a first substrate carrier engaged with a first magnetic levitation track positioned proximate to a bottom surface of the transfer chamber, wherein the first magnetic levitation track has a face-up orientation configured to generate a first magnetic field above the first magnetic levitation track;
generating the first magnetic field by the first magnetic levitation track to move the first substrate carrier with the first substrate in a first direction along the first magnetic levitation track;
lifting, with a first lift pin assembly, the first substrate carrier with the first substrate to a second magnetic levitation track positioned proximate to a top surface of the transfer chamber, wherein the second magnetic levitation track has a face-down orientation configured to generate a second magnetic field below the second magnetic levitation track;
detecting that the first substrate carrier is proximate to the second magnetic levitation track; and
generating the second magnetic field to suspend the first substrate carrier below the second magnetic levitation track and to move the first substrate carrier with the first substrate in a second opposite direction along the second magnetic levitation track.

20. The method of claim 19, further comprising:
lifting, with a second lift pin assembly, the second substrate carrier with the second substrate to the second magnetic levitation track;
detecting that the second substrate carrier is proximate to the second magnetic levitation track;
generating the second magnetic field to suspend the second substrate carrier below the second magnetic levitation track and to move the second substrate carrier with the second substrate in the second direction along the second magnetic levitation track.

* * * * *